(12) United States Patent
Kurita

(10) Patent No.: US 7,993,942 B2  
(45) Date of Patent: Aug. 9, 2011

(54) METHOD OF DETECTING HEAVY METAL IN SEMICONDUCTOR SUBSTRATE

(75) Inventor: Kazunari Kurita, Tokyo (JP)

(73) Assignee: Sumco Corporation, Tokyo (JP)

( * ) Notice: Subject to any disclaimer, the term of this patent is extended or adjusted under 35 U.S.C. 154(b) by 103 days.

(21) Appl. No.: 12/422,395

(22) Filed: Apr. 13, 2009

(65) Prior Publication Data

US 2009/0258447 A1    Oct. 15, 2009

(30) Foreign Application Priority Data

Apr. 15, 2008 (JP) .................................. 2008-105782

(51) Int. Cl.
  *H01L 21/66* (2006.01)
  *G01R 31/26* (2006.01)
(52) U.S. Cl. .............................. 438/18; 257/E21.531
(58) Field of Classification Search .................... 438/14, 438/16, 18; 326/16; 324/754
See application file for complete search history.

(56) References Cited

U.S. PATENT DOCUMENTS

| | | | |
|---|---|---|---|
| 5,036,271 A | | 7/1991 | Mazur et al. |
| 5,298,860 A | * | 3/1994 | Kato .................. 324/762.01 |
| 5,734,195 A | | 3/1998 | Takizawa et al. |
| 5,760,594 A | * | 6/1998 | Lee ............................... 324/663 |
| 5,874,348 A | | 2/1999 | Takizawa et al. |
| 6,140,213 A | | 10/2000 | Takizawa et al. |
| 6,168,961 B1 | | 1/2001 | Vaccari |
| 2003/0170928 A1 | | 9/2003 | Shimozono et al. |
| 2007/0105344 A1 | * | 5/2007 | Uchida et al. ................. 438/459 |

FOREIGN PATENT DOCUMENTS

| | | |
|---|---|---|
| JP | 6-140478 | 5/1994 |
| JP | 6-338507 | 12/1994 |
| JP | 2002-516486 | 6/2002 |
| JP | 2002-353434 | 12/2002 |
| JP | 2006-313922 | 11/2006 |
| WO | 99/60615 | 11/1999 |

* cited by examiner

*Primary Examiner* — Matthew Smith  
*Assistant Examiner* — Christine Enad  
(74) *Attorney, Agent, or Firm* — Greenblum & Bernstein, P.L.C.

(57) ABSTRACT

A method of detecting heavy metal in a semiconductor substrate, includes: a gate oxide film forming step of forming an organic oxide film by spin coating or a sol-gel process, and forming a metal/oxide film/semiconductor junction element by using a mercury probe method; and a step of detecting and quantifying heavy metal by calculating the surface concentration of the heavy metal from junction capacitance characteristics of the element.

7 Claims, 4 Drawing Sheets

METHOD OF DETECTING HEAVY METAL IN SEMICONDUCTOR SUBSTRATE

BACKGROUND OF THE INVENTION

1. Field of the Invention

The present invention relates to a method of detecting heavy metal in a semiconductor substrate, and more particularly, to a technique used for a method of detecting heavy metal in a thin semiconductor chip or a silicon wafer.

Priority is claimed on Japanese Patent Application No. 2008-105782, filed on Apr. 15, 2008, the content of which is incorporated herein by reference.

2. Description of the Related Art

With the development of mobile phones, small and light electronic components are required to be mounted inside the devices. Accordingly, in order to reduce the thickness of a semiconductor package, a thinning process is performed to make the thickness of a semiconductor chip to be as small as possible. In the thinning process, a gettering sink for gettering heavy metal when heavy metal contamination occurs is thinned by the thinning process. Therefore, a gettering capability is significantly degraded, and the proportion of devices with good quality is decreased.

In the related art, in order to avoid heavy metal contamination in the vicinity of a device active layer, the following methods have been used: an IG (intrinsic gettering) method of forming an oxygen precipitate on a silicon substrate; and an EG (extrinsic gettering) method of forming a gettering site such as backside damage on the rear surface of a silicon substrate.

A technique related to the IG method is disclosed in JP-A-6-338507 and JP-A-2002-353434, and an example of the EG method described in the paragraph [0005] is disclosed in JP-T-2006-313922. In addition, an Hg-CV method is disclosed in JP-A-6-140478 and JP-A-2002-516486.

For example, heavy metal is incorporated into the thin semiconductor substrate (silicon wafer or semiconductor chip) as impurities by the following two causes: first, metal contamination during a process of manufacturing a silicon substrate including single crystal pulling, slicing, chamfering, and treatments such as polishing, grinding, etching, and epitaxial layer forming; and second, heavy metal contamination during a process of manufacturing a device element, that is, a device process including a device manufacturing process of forming a circuit on the silicon substrate and the subsequent thinning process by grinding and the like. In addition, the process of manufacturing a silicon substrate or a device requires heat treatment performed at high temperature for a long time. Therefore, there is a concern that the metal contamination of a silicon substrate will increase during the heat treatment or between processes.

SUMMARY OF THE INVENTION

Recently, thinner devices having thicknesses of 50 μm, 40 μm or less, and about 30 μm are required. In addition, the heavy metal contamination mostly occurs during the thinning process that is the final step of the device manufacturing process, and therefore there is a problem in that the proportion of devices with good quality is reduced by the heavy metal contamination during the thinning process. Accordingly, in order to investigate the cause of device defects and improve the state thereof, detection of heavy metal that is the main cause is necessary.

However, since handling of the thin substrate subjected to the thinning process is different from that of a silicon substrate having a thickness of 700 to 1000 μm, a technique for detecting heavy metal in a thin substrate has not been established yet.

Particularly, reduction in strength caused by the thinning process, diffusion of heavy metal to be measured due to high-temperature heat treatment during detection, instability in measurement, and additional heavy metal contamination due to heat treatment during measurement are thought to be the causes of failing in giving guaranteed accuracy of measurement results.

As a result, there were problems in that whether or not a sufficient gettering capability is shown in the thinning process that is the final step of the device manufacturing process could not be evaluated, and there was a possibility that factors of device defects during the manufacturing of a silicon substrate could not be avoided.

The invention is designed to solve the above-mentioned problems. Objects of the invention are as follows:

1. To establish a method of measuring heavy metal contamination in a thin semiconductor substrate.
2. To enhance accuracy of measurement of heavy metal contamination in a thin semiconductor substrate.
3. To enable measurement of a gettering capability shown in a device process that is the subsequent step in a process of manufacturing of a semiconductor substrate (silicon wafer).
4. To enable manufacturing of a semiconductor substrate with improved certainty of a gettering capability.
5. To clarify the cause of device defects by detecting heavy metal incorporated into a silicon wafer as impurities during a process of assembling and forming a thin semiconductor package and reduce the proportion of defective devices.

According to an aspect of the invention, there is provided a method of detecting heavy metal in a semiconductor substrate, including: a gate oxide film forming step of forming an organic oxide film on a semiconductor substrate by spin coating or a sol-gel process, and forming a metal/oxide film/semiconductor junction element by using a mercury probe method; and a step of detecting and quantifying heavy metal by calculating the surface concentration of the heavy metal from junction capacitance characteristics of the element.

In the above aspect of the invention, the thickness of the semiconductor substrate may be equal to or less than 700 μm.

In the aspect of the invention, the method may further include a measurement step of heating the semiconductor substrate on a hot plate at room temperature or at a temperature of 50° C. or higher or 200° C. or below, and measuring temperature characteristics of the junction capacitance by using the mercury probe method.

In the aspect of the invention, the method may further include: an initial contamination step of allowing initial surface heavy metal contamination on the surface of a reference semiconductor substrate at a predetermined concentration; a diffusion heat treatment step of allowing the heavy metal to diffuse by performing heat treatment on the reference semiconductor substrate; an initial gate oxide film forming step of forming a gate oxide film on the reference semiconductor substrate in the gate oxide film forming step; an initial measurement step of measuring temperature characteristics of the junction capacitance of the reference semiconductor substrate in a measurement step; a quantification step of obtaining a line of correlation between the concentration of initial surface heavy metal contamination and the temperature characteristics of the junction capacitance; a measurement step of measuring the temperature characteristics of the junction capacitance of the semiconductor substrate to be measured, in the measurement step; and a detection step of detecting a heavy metal concentration distribution on the surface of the semiconductor substrate to be measured, from the measurement results in the measurement step on the basis of the correlation line.

In the method of detecting heavy metal in a semiconductor substrate according to the aspects of the invention, the gate oxide film can be formed by performing growth of the organic oxide film at low temperature such as a temperature of 200° C. or below, and more preferably 180° C. or below. Accordingly, the metal/oxide film/semiconductor junction element can be simply formed, and quantifying the surface contamination concentration of the heavy metal from the bias dependence of the junction capacitance can be implemented.

According to the aspects of the invention, by forming the organic oxide film on the thin semiconductor chip or silicon wafer, the metal/oxide film/semiconductor junction element can be simply manufactured, and quantifying the concentration of the heavy metal contamination from the bias dependence of the junction capacitance can be implemented.

DETAILED DESCRIPTION OF THE INVENTION

Hereinafter, a method of detecting heavy metal in a semiconductor substrate according to an embodiment of the invention will be described with reference to the accompanying drawings.

Figure 1:
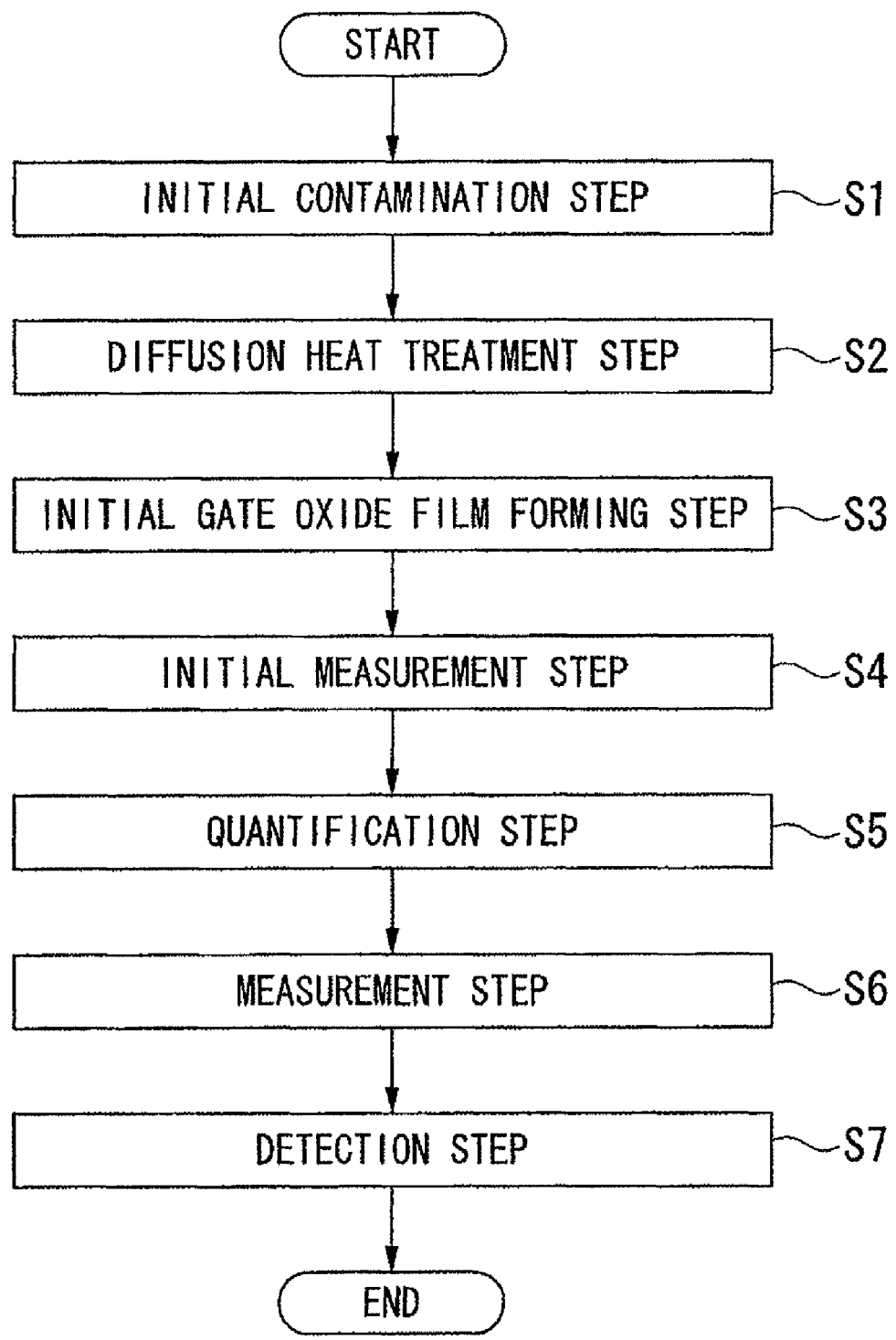
FIG. 1 is a flowchart illustrating a method of detecting heavy metal in a semiconductor substrate according to an embodiment of the invention.

FIG. 1 is a flowchart illustrating the method of detecting heavy metal in a semiconductor substrate according to the embodiment.

According to the embodiment, as illustrated in FIG. 1, the method includes an initial contamination step S1, a diffusion heat treatment step S2, an initial gate oxide film forming step S3, an initial measurement step S4, a quantification step S5, a measurement step S6, and a detection step S7. It is possible to give appropriate modification in these steps, such as changing the order of steps or omitting the step(s), depending on the purpose.

According to the embodiment, the semiconductor substrate (a semiconductor chip and a silicon wafer) that is subjected to measurement and detection of heavy metal contamination, includes a silicon substrate (wafer) which is sliced from a single crystal pulled by a CZ method to have a thickness of about 700 μm, or 500 to 800 μm. In this state, an epitaxial layer may be formed on the surface of the substrate, or a device element may be formed on the surface. In addition, a device forming process and a thinning process such as grinding by about 30 to 50 μm which is the subsequent step are performed on the substrate for thinning the substrate.

According to the embodiment, heavy metal as a contaminant source, is a transition metal such as copper (Cu) and nickel (Ni), has a high diffusion constant in a silicon crystal, and has an effect on device characteristics. Hereinafter, measuring copper as the contaminant source will be described.

First, in order to enable measurement of heavy metal contamination in a semiconductor substrate to be measured, samples for obtaining a line of correlation between the concentration of heavy metal contamination and a junction capacitance, are prepared.

In the initial contamination step S1 illustrated in FIG. 1, on the surface of the reference semiconductor substrate having the aforementioned thickness, initial surface heavy metal (copper) contamination is generated in advance at 5 stages of concentrations of 0 atoms/cm$^2$ (no contamination), $1\times10^{11}$ atoms/cm$^2$, $1\times10^{12}$ atoms/cm$^2$, $1\times10^{13}$ atoms/cm$^2$, and $1\times10^{14}$ atoms/cm$^2$.

For the concentrations of initial heavy metal contamination, in order to obtain a line of correlation as described later, 4 to 6 stages need to be set. In addition, in consideration of contamination states in a practical wafer manufacturing process and a device process (thinning process), the above-mentioned concentrations are preferably set. However, setting is not limited to the above-mentioned concentrations as long as a line of collection can be obtained.

Next, in the diffusion heat treatment step S2 illustrated in FIG. 1, heavy metal (copper) is allowed to diffuse at 900° C. for 30 minutes or by heat treatment corresponding to this condition. By this diffusion heat treatment, copper diffuses to a bulk inside the wafer. Copper which had been diffused to the bulk maintains a positive electric charge state (positive ion) in a crystal and is in the state where copper can diffuse in a crystal space. The condition of 900° C. for 30 minutes or the heat treatment corresponding to this condition satisfies the condition for copper to diffuse in the bulk to the same extent.

Next, in the initial gate oxide film forming step S3 illustrated in FIG. 1, as the gate oxide film, an organic oxide film is formed on the surface of the reference semiconductor substrate by spin coating or a sol-gel process.

Here, in the spin coating method, polymethylmethacrylate is applied as the coating material, and in the sol-gel method, polymethylmethacrylate is also applied. In addition, heat treatment is performed at 180° C. or below for about 10 minutes, thereby forming an organic oxide film (gate oxide film) S.

The thickness of the gate oxide film may be set to be about 1 μm.

In addition, by using a mercury probe (Hg—CV) method, a metal/oxide film/semiconductor junction element is formed.

Figure 2:
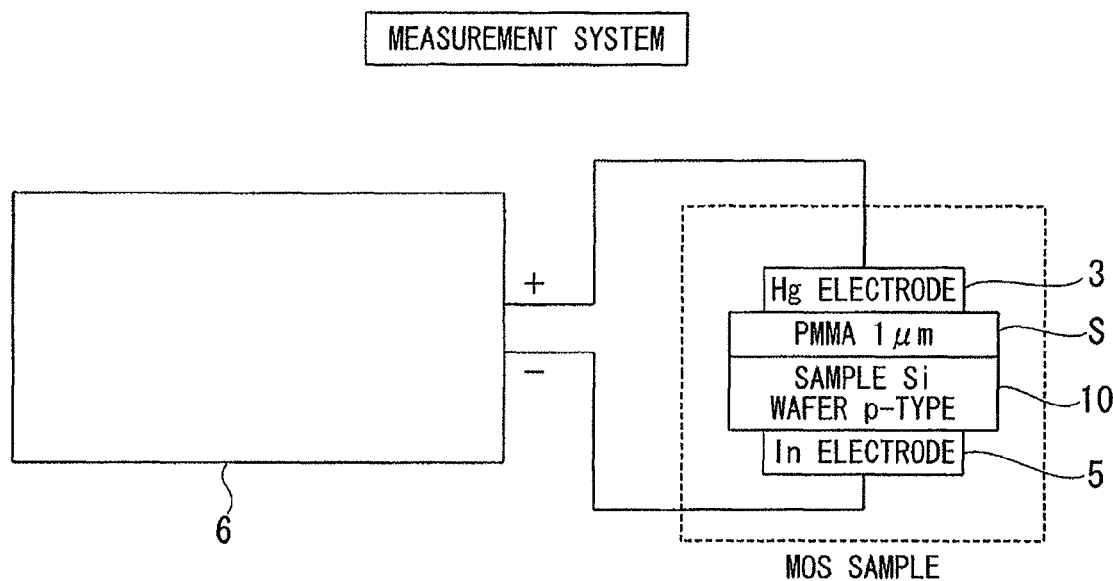
FIG. 2 is a schematic view illustrating a junction capacitance measurement system for measuring bias dependence of a junction capacitance by using a gate electrode as a mercury probe.
Figure 3:
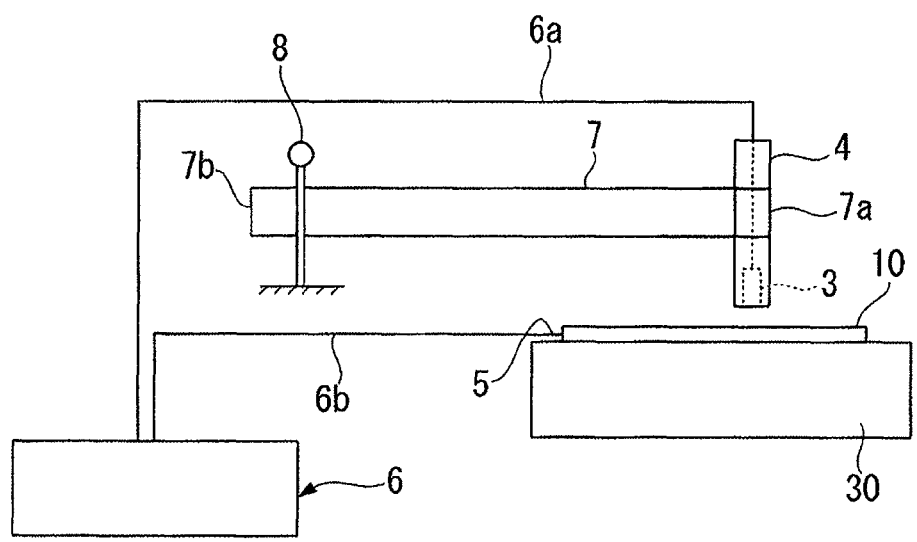
FIG. 3 is a schematic view illustrating a configuration of a resistivity measurement apparatus.
Figure 4:
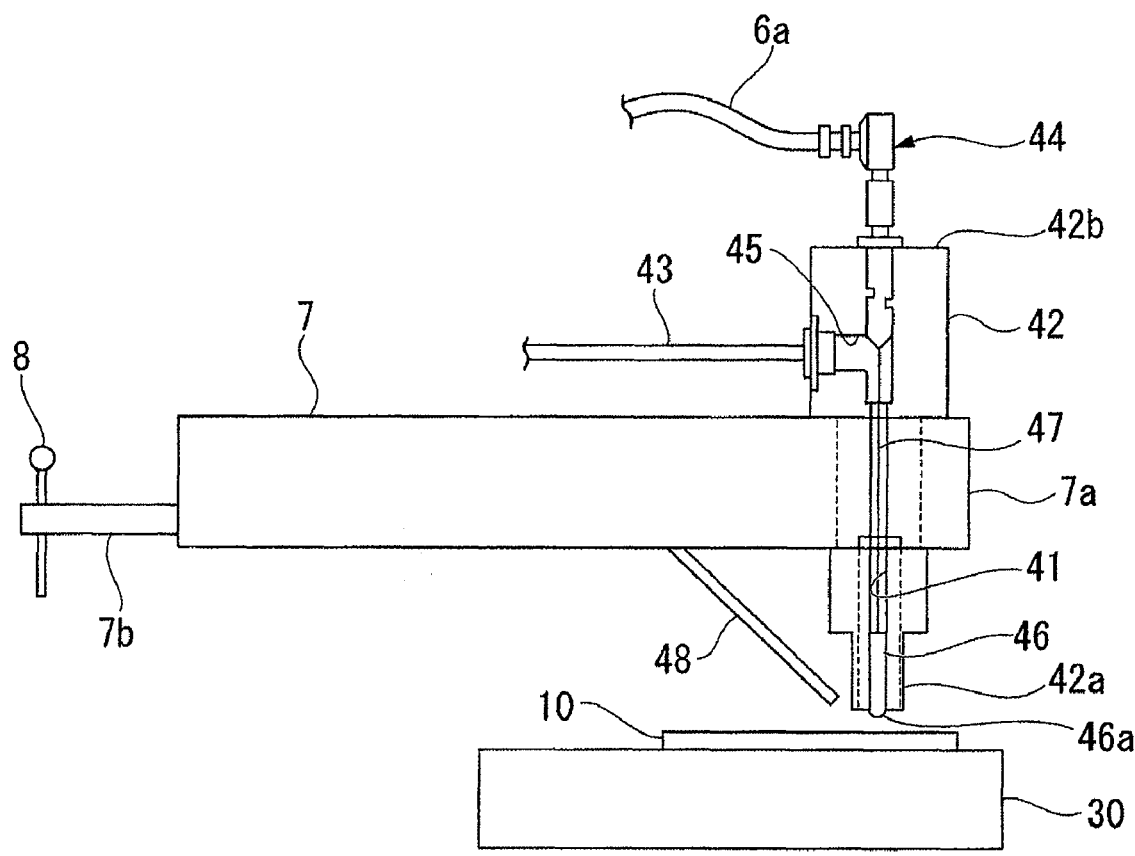
FIG. 4 is an exploded schematic view illustrating a configuration of a measurement probe of the resistivity measurement apparatus.

FIG. 2 is a view illustrating a junction capacitance measurement system for measuring bias dependence of a junction capacitance by using a gate electrode as a mercury probe according to the embodiment. FIGS. 3 and 4 are schematic views illustrating a resistivity measurement apparatus according to the embodiment.

As illustrated in FIGS. 3 and 4, the resistivity measurement apparatus 1 according to the embodiment includes a measurement probe 4 having a metal electrode 3 for performing measurement by contacting the oxide film S of the surface of a semiconductor substrate (silicon wafer) 10, a measurement electrode 5 in contact with the wafer 10, and a measurement unit 6 connected to the electrodes 3 and 5 for measuring the resistivity of the wafer 10.

The resistivity measurement apparatus 1 further includes an XY stage 30 on which the epitaxial wafer 10 is placed, and a transporter not shown for transporting the wafer 10 after the pre-processing is completed, from a pre-processor 2 to the XY stage 30. In addition, the metal electrode 3 of the measurement probe 4 is configured to contact the top surface of the wafer 10 placed on the XY stage 30. According to the embodiment, instead of the XY stage, an R-.theta. stage may be used.

The resistivity measurement apparatus 1 includes a supporting arm 7, a front end 7a of the supporting arm 7 is mounted with the measurement probe 4, and the other end 7b thereof is provided with an arm driving mechanism 8. The arm driving mechanism 8 is configured to drive the supporting arm 7 to move in horizontal and vertical directions, and therefore the measurement probe 4 can be moved to an arbitrary measurement position of the epitaxial wafer 10.

The metal electrode 3 is connected to the measurement unit 6 via a wire 6a, and the measurement electrode 5 is connected to the measurement unit 6 via a wire 6b. The wafer 10, the electrodes 3 and 5, and the measurement unit 6 constitute a measurement circuit. The measurement unit 6 may be any unit if it enables measuring the capacitance (C)-voltage (V) characteristics (which can be measured by capacitance-voltage profiling).

In the resistivity measurement apparatus 1 according to the embodiment, the wafer 10 is placed on the XY stage 30, and the metal electrode 3 and the measurement electrode 5 are connected to the wafer 10, and the resistivity of the wafer 10 is then measured by the metal electrode 3, the measurement electrode 5, and the measurement unit 6.

As illustrated in FIGS. 3 and 4, the measurement probe 4 mainly includes a probe main body 42 having a capillary tube (hereinafter, referred to as a capillary) 41 inside, a compressed gas supplying tube 43 and an electrode terminal 44, each of which is connected to the probe main body 42. The capillary 41 is provided to pass through from a front end portion 42a to a rear end portion 42b of the probe main body 42 in a longitudinal direction of the probe main body 42. The front end portion 42a of the capillary 41 is filled with mercury (mercury electrode) 46, and the front end portion 42a of the capillary 41 is blocked by the mercury 46. In addition, the rear end portion 42b of the probe main body 42 is mounted with the electrode terminal 44, and the rear end portion 42b of the capillary 41 is blocked by the electrode terminal 44. A branch 45 of the capillary 41 is provided near the rear end portion 42b of the probe main body 42, and the compressed gas supplying tube 43 is connected to the end of the branch 45. Pressure adjustment means not shown is connected to the end of the compressed gas supplying tube 43.

By operating the pressure adjustment means not shown, the internal pressure of the capillary 41 can be adjusted via the compressed gas supplying tube 43. With regard to the capillary 41, since the rear end portion 42b is blocked by the electrode terminal 44 and the front end portion 42a is blocked by the mercury 46, the mercury 46 at the front end portion 42a is moved in the longitudinal direction of the capillary 41 according to the internal pressure as the internal pressure of the capillary 41 is changed. It is preferable that the internal pressure of the capillary 41 be set so that a front end 46a of the mercury 46 protrudes from the front end portion 42a of the probe main body 42. The front end portion 46a of the mercury 46 is formed into a drop by a surface tension of the mercury, and only the front end portion 46a formed into the drop comes in contact with the surface of the wafer 10.

The electrode terminal 44 is mounted with a metal wire 47 inserted into the capillary 41, and the front end of the metal wire 47 comes in contact with the mercury 46. The mercury 46 and the metal wire 47 constitute the metal electrode 3. In addition, the electrode terminal 44 is connected with the wire 6a, and via the wire 6a, the metal wire 47 and the mercury 46 are connected to the measurement unit 6.

The supporting arm 7 is provided with a gas supplying tube 48, and through the gas supplying tube 48, an inert gas such as nitrogen gas is supplied to the vicinity of the front end portion 46a of the mercury 46.

When the measurement electrode 5 is in contact with the rear surface of the wafer 10 and at the same time, the mercury electrode 3 is in contact with the surface of the oxide film S of the wafer 10, as illustrated in FIG. 2, a junction is formed between the mercury electrode and the oxide film.

Otherwise, the measurement electrode 5 may not be brought into contact with the rear surface of the wafer 10 but may be simply formed by deposition.

Next, in the initial measurement step S4 illustrated in FIG. 1, the semiconductor substrate 10 is heated on a hot plate at room temperature or a temperature of 50° C. or higher or 200° C. or below to measure temperature characteristics of the junction capacitance by using the mercury probe method.

Temperature control means not shown is provided in the XY stage 30, and the temperature control means sets the measurement temperature condition.

Here, while the junction is formed between the mercury electrode and the oxide film by the measurement electrode 5 contacting the rear surface of the wafer 10 and the mercury electrode 3 contacting the surface of the oxide film S of the wafer 10, the measurement unit 6 transmits an electrical stimulus to the wafer 10, detects a response of the wafer 10 to the electrical stimulus, and converts the detection results into C-V characteristics (capacitance-voltage characteristics).

Figure 5:
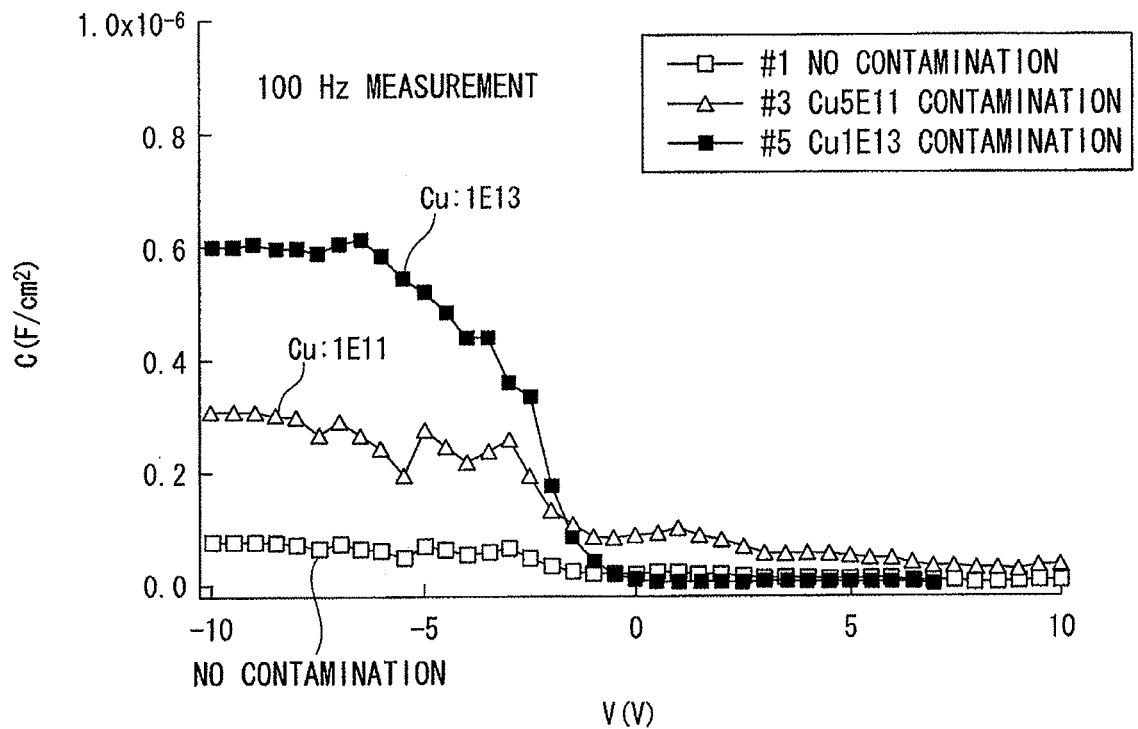
FIG. 5 is a view illustrating C-V characteristics according to the embodiment of the invention.

According to the embodiment, when a negative bias is applied to the gate oxide film S formed by applying the organic oxide film by using the mercury probe method, copper positively charged localizes on the interface of the gate oxide film S and increases the junction capacitance. The increase in junction capacitance strongly depends on the positively changed copper ion that localizes on the interface. Accordingly, the bias dependence of the junction capacitance is measured from the C-V characteristics. An example of measurement of the C-V characteristics is shown in FIG. 5.

Figure 6:
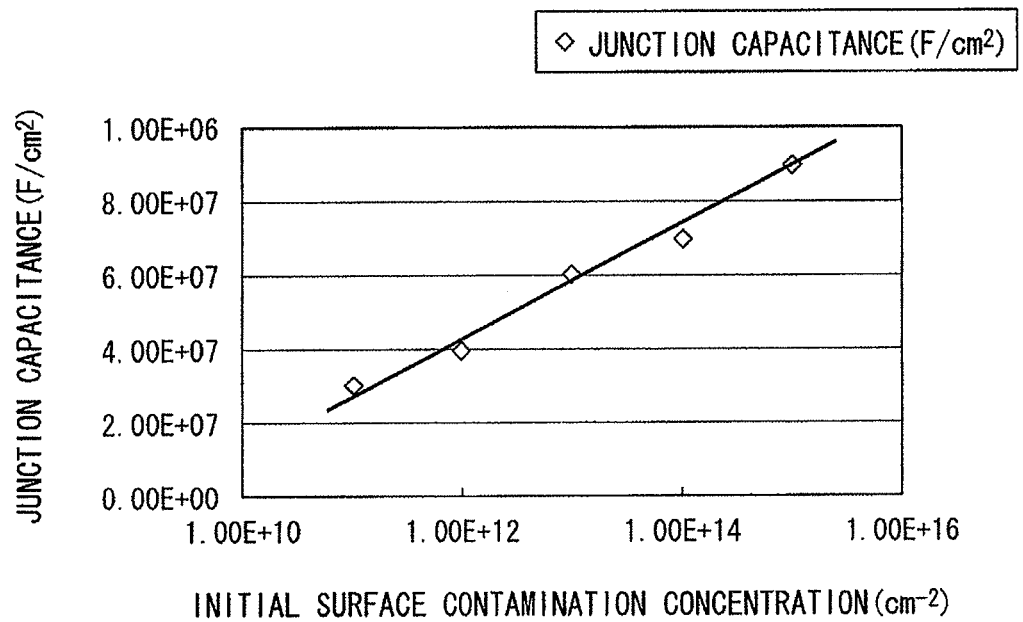
FIG. 6 is a view illustrating a line of correlation according to the embodiment of the invention.

Next, in the quantification step S5 illustrated in FIG. 1, in order to evaluate the heavy metal concentration existing on the surface of the wafer 10, from the C-V characteristics measured in the initial measurement step S4, as illustrated in FIG. 6, a relationship between the concentration of the heavy metal set in the initial contamination step S1 and a junction capacitance F is calculated from the measurement results of the C-V characteristics by calculation means of the measurement unit 6 to specify and store a line of the correlation in memory means of the measurement unit 6.

Next, in the measurement step S6 illustrated in FIG. 1, as in the above-mentioned initial measurement step S3, C-V characteristics of a semiconductor substrate to be measured with an unknown heavy metal concentration are measured.

Here, the heat treatment the same as that performed in the diffusion heat treatment step S2 may be performed before the measurement.

Next, in the detection step S7 illustrated in FIG. 1, the heavy metal concentration distribution of the semiconductor substrate to be measured is evaluated and detected from the C-V characteristics measured in the measurement step S6 on the basis of the correlation line obtained in the quantification step S5, by the calculating means of the measurement unit 6.

According to the embodiment, the metal/oxide film/semiconductor junction element can be easily manufactured by forming the organic oxide film on the semiconductor substrate (thin semiconductor chip or silicon wafer). Therefore, quantifying the contamination concentration of the heavy metal from the bias dependence of the junction capacitance can be implemented.

In addition, according to the detection method of the embodiment, handleability of the thin semiconductor substrate is not deteriorated. Therefore, it is possible to perform measurement and detection easily.

In addition, by preparing the reference semiconductor substrate having the same dopant type and concentration as those of the semiconductor substrate to be measured, it is possible to exclude influences of factors other than the contaminant heavy metal.

For the embodiment, the case where copper diffuses in the silicon crystal is explained. However, when the correlation lines as illustrated in FIG. 6 are created according to contaminant metallic elements, it is possible to quantify the surface contamination concentration of contaminant metal from the junction capacitance obtained from the bias dependence of the junction capacitance when an unknown sample is measured.

In addition, in order to set the contamination concentration in the initial contamination step S1 and the heat treatment conditions in the initial heat treatment step S2 and the measurement step S6, heat treatment of a required device process is imitated, thereby estimating the degree of heavy metal contamination after a practical device process. In addition, according to the detection method of the embodiment, it is possible to detect the degree of heavy metal contamination during manufacturing of a practical device. Therefore, it does not affect the device characteristics. Accordingly, an accurate design for the degree of needed gettering capability during the manufacturing of the semiconductor substrate (silicon wafer) is possible.

In addition, in order to form the oxide film, the heat treatment is performed at 180° C. or below after applying a carbon-containing material.

What is claimed is:

1. A method of detecting heavy metal in a semiconductor substrate, comprising:
    applying a carbon-containing material to a surface of the semiconductor substrate by spin coating or a sol-gel process;
    heating the carbon-containing material at 180° C. or below to form a gate oxide film on the semiconductor substrate after the applying;
    forming a metal/oxide film/semiconductor junction element by using a mercury probe method after the heating; and
    detecting and quantifying heavy metal by calculating the surface concentration of the heavy metal from junction capacitance characteristics of the element after forming the metal/oxide film/semiconductor junction element.

2. The method according to claim 1, wherein the thickness of the semiconductor substrate is equal to or less than 700 μm.

3. The method according to claim 2, further comprising a measurement step of heating the semiconductor substrate on a hot plate at room temperature or at a temperature of 50° C. or higher or 200° C. or below, and measuring temperature characteristics of the junction capacitance by using the mercury probe method.

4. The method according to claim 1, further comprising a measurement step of heating the semiconductor substrate on a hot plate at room temperature or at a temperature of 50° C. or higher or 200° C. or below, and measuring temperature characteristics of the junction capacitance by using the mercury probe method.

5. The method according to claim 1, further comprising:
    an initial contamination step of allowing initial surface heavy metal contamination on the surface of a reference semiconductor substrate at a predetermined concentration;
    a diffusion heat treatment step of allowing the heavy metal to diffuse by performing heat treatment on the reference semiconductor substrate;
    an initial gate oxide film forming step of forming a gate oxide film on the reference semiconductor substrate in the gate oxide film forming step;
    an initial measurement step of measuring temperature characteristics of the junction capacitance of the reference semiconductor substrate in a measurement step;
    a quantification step of obtaining a line of correlation between the concentration of initial surface heavy metal contamination and the temperature characteristics of the junction capacitance;
    a measurement step of measuring the temperature characteristics of the junction capacitance of the semiconductor substrate to be measured, in the measurement step; and
    a detection step of detecting a heavy metal concentration distribution on the surface of the semiconductor substrate to be measured, from the measurement results in the measurement step on the basis of the correlation line.

6. The method according to claim 1, wherein the detected heavy metal are copper and nickel.

7. The method according to claim 1, wherein the carbon-containing material is polymethylmethacrylate.

* * * * *